United States Patent
Haji et al.

(10) Patent No.: US 6,511,917 B2
(45) Date of Patent: Jan. 28, 2003

(54) PLASMA TREATMENT APPARATUS AND METHOD

(75) Inventors: Hiroshi Haji, Fukuoka (JP); Kiyoshi Arita, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 26 days.

(21) Appl. No.: 09/769,763

(22) Filed: Jan. 26, 2001

(65) Prior Publication Data
US 2001/0018272 A1 Aug. 30, 2001

(30) Foreign Application Priority Data
Jan. 26, 2000 (JP) .......................... 2000-016766

(51) Int. Cl.$^7$ ............................................. H01L 21/302
(52) U.S. Cl. ........................................ 438/706; 438/714
(58) Field of Search ............................... 118/719, 723; 156/345; 438/706, 710, 714, 715

(56) References Cited

U.S. PATENT DOCUMENTS

| | | | |
|---|---|---|---|
| 5,542,559 A | * 8/1996 | Kawakami et al. | 118/723 E |
| 5,584,933 A | * 12/1996 | Saito | 118/664 |
| 5,685,949 A | * 11/1997 | Yashima | 134/1.1 |
| 5,855,679 A | * 1/1999 | Ogawa | 118/719 |
| 6,165,276 A | * 12/2000 | Lu et al. | 118/728 |
| 6,239,036 B1 | * 5/2001 | Arita et al. | 156/345.47 |

* cited by examiner

Primary Examiner—Benjamin L. Utech
Assistant Examiner—Kin-chan Chen
(74) Attorney, Agent, or Firm—McDermott, Will & Emery

(57) ABSTRACT

A plasma treatment apparatus according to the present invention includes a vacuum chamber, an upper electrode and a lower electrode disposed in the vacuum chamber, a high-frequency power supply for applying a high-frequency voltage, a space adjusting device for adjusting the spacing between the two electrodes, and a workpiece-transfer-device for transferring to and from a space between the two electrodes. The plasma treatment apparatus can decrease the spacing between the two electrodes and thereby increase the etching rate. Further, the workpiece can be easily transferred to and from the space between the two electrodes by opening the spacing.

11 Claims, 8 Drawing Sheets

PLASMA TREATMENT APPARATUS AND METHOD

FIELD OF THE INVENTION

The present invention relates to a plasma treatment apparatus and a plasma treatment method for etching and cleaning the surface of a workpiece (hereafter called a work).

BACKGROUND OF THE INVENTION

In the electric industry, a plasma treatment is known for etching the surface of a semiconductor wafer (hereafter called a wafer) and cleaning the surface of a printed circuit board. The plasma treatment apparatus holds the work such as a wafer, the printed board or the like between two electrodes in a vacuum chamber, and generates plasma by applying a high-frequency voltage between these electrodes and performs the plasma treatment by bombarding ions, which are generated between two electrodes, against the surface of the work.

Deep etching (for example 5 $\mu$m) over the wafer is needed to thin the wafer or to remove a stress layer (a layer having cracks by machine grinding) in the polished surface of the wafer. However, in the conventional plasma treatment apparatus, if plasma density is low and also the etching rate (an etching speed) is low, it takes much time to perform deep-etching, therefore, the conventional plasma treatment is difficult or is practically impossible to use in these circumstances from an economical aspect.

In a conventional plasma treatment apparatus, it is preferable to increase plasma density by narrowing the spacing between two electrodes to provide a high etching rate.

However, a holding head holds the work to be plasma treated, such as the wafer or printed circuit board, and transfers to and from a space between the electrodes. When the spacing narrows by closing the spacing between the electrodes, it is difficult or impossible to transfer the work to and from the space between the electrodes with the holding head.

Moreover, in the conventional plasma treatment apparatus, the work is fixed on a lower electrode by a static chuck. As the static chuck is quite expensive, and it results in a high cost.

The purpose of the present invention is to provide a plasma treatment apparatus with increased etching rate by closing a spacing between two electrodes during a plasma treatment and to provide an inexpensive plasma treatment apparatus which can transfer the work to and from the apparatus easily, thereby solving the foregoing problems.

SUMMARY OF THE INVENTION

A plasma treatment apparatus in the present invention comprises:

(1) a vacuum chamber;
(2) an upper electrode and a lower electrode;
(3) a high-frequency power supply applying a high-frequency voltage to the upper and lower electrode;
(4) a space adjusting means for adjusting a spacing between the upper electrode and the lower electrode; and
(5) a work-transfer means for transferring the work to and from the space between the upper electrode and the lower electrode.

According to the configuration of the present invention, the upper electrode and the lower electrode are kept closed to each other during a plasma treatment and an etching rate can be increased, therefore, a plasma treatment becomes faster. Moreover, when transferring the work to and from the space between the electrodes, the space between the upper electrode and the lower electrode is opened, and the work can be transferred to and from the space with ease.

DESCRIPTION OF THE PREFERRED EMBODIMENTS

An embodiment of the present invention will be described hereafter with reference to the accompanying drawings.

Figure 1:
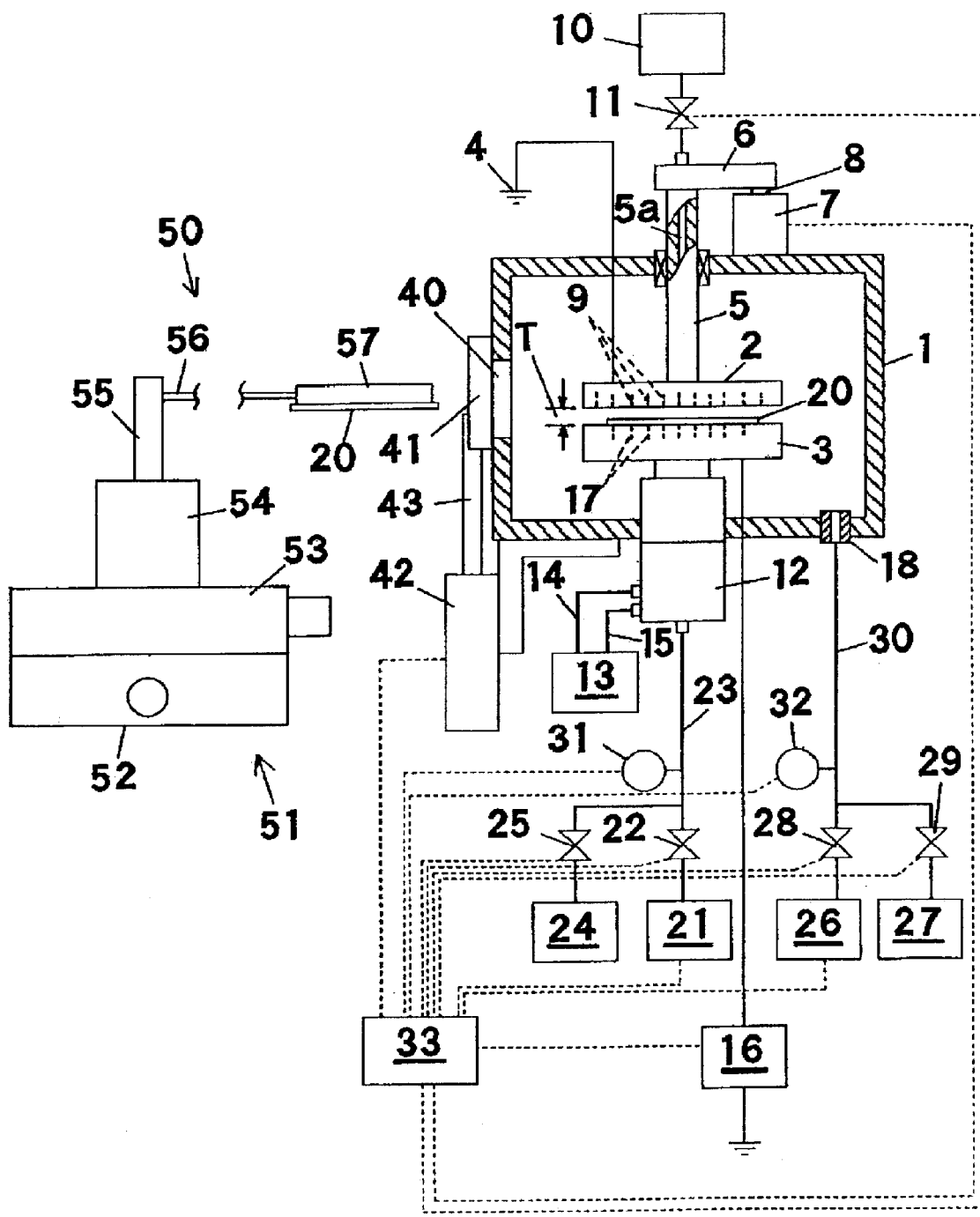
FIG. 1 is a schematic diagram of a plasma treatment apparatus in accordance with an exemplary embodiment of the present invention.
Figure 7:
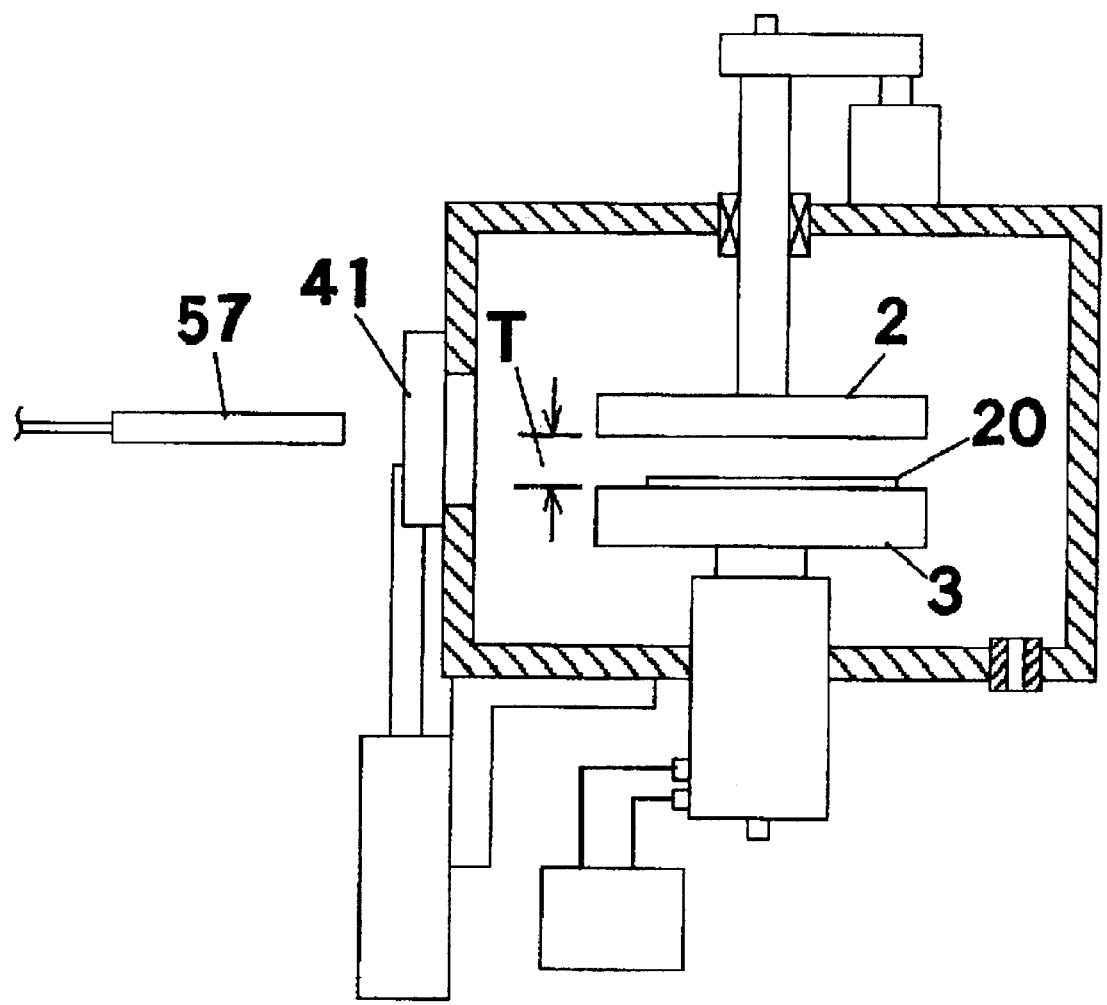
FIG. 7 is a cross sectional view of the plasma treatment apparatus in accordance with the exemplary embodiment of the present invention.
Figure 8:
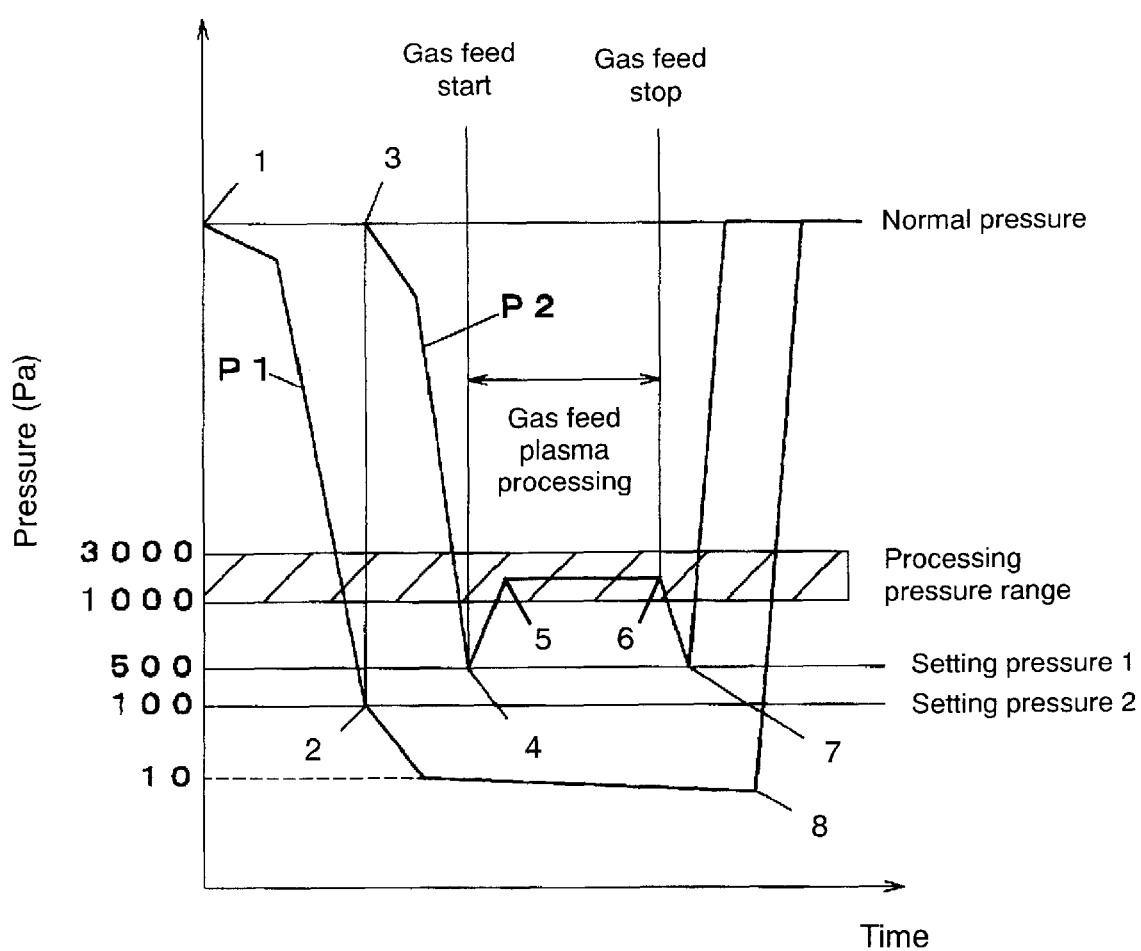
FIG. 8 is a graph showing changes in pressure in accordance with the exemplary of the present invention.

FIG. 1 is a schematic diagram of a plasma treatment apparatus according to the embodiment of the present invention. FIG. 2 through FIG. 7 is a cross sectional view showing each process of a plasma treatment. FIG. 8 is a graph showing changes in pressure according to the embodiment of the present invention.

First, an overview of the configuration of the plasma treatment apparatus is described with reference to FIG. 1. Two electrodes, upper electrode 2 and lower electrode 3, are placed so as to be opposed to each other at a predetermined spacing T in vacuum chamber 1. Upper electrode 2 is coupled to ground 4 and also vacuum chamber 1 is grounded.

Upper electrode 2 can move vertically and is coupled to the lower end of shaft 5 passing through the upper wall of chamber 1. The upper end of shaft 5 is coupled to rod 8 of cylinder 7 via arm 6. Therefore, when rod 8 is press down into and pull up from cylinder 7, shaft 5 and electrode 2 move vertically, as a result, spacing T between electrode 2 and electrode 3 is adjusted. Namely, cylinder 7 is a space-adjusting means of adjusting spacing T by changing a height of electrode 2 relative to electrode 3.

As a means for vertical movement of electrode 2, in addition to cylinder 7, a well-known direct-acting means, such as a feed screw mechanism, different toothed wheels mechanism or the like, can be used. Moreover, spacing T is adjusted by moving electrode 2 vertically relative to electrode 3 in the embodiment, spacing T can also be adjusted by moving electrode 3 vertically relative to fixed electrode 2 and further by moving vertically both electrodes. Furthermore, either chamber 1 or the upper wall of electrode 3 can function as the upper electrode. In this situation, spacing T is adjusted by moving electrode 3 vertically.

In FIG. 1, shaft 5 is coupled to gas-supply section 10 via valve 11. Shaft 5 is made of a hollow pipe. When valve 11 is opened, gases for generating plasma are supplied to electrode 2 from gas-supply section 10 through path 5a in the center of shaft 5 and then the gases blow off from a plurality of gas-blow-off holes 9 toward electrode 3. As a method of forming gas-blow-off holes, porous members which have a plurality of gas-blow-off holes is placed underneath upper electrode 2 and gases can be blown off from this porous member. Sintered metals and sintered conductive ceramics are preferably used as the porous member. By using these conductive members it is possible to maintain a short spacing between the electrodes, and a high-density and uniform plasma.

In FIG. 1, joint 12 supports electrode 3. Joint 12 is placed on the bottom wall of vacuum chamber 1. Cooling device 13 cools electrode 3 and work 20 placed on electrode 3 and heated by plasma treatment by circulating coolant, such as cool water, through a coolant path (not shown) formed in electrode 3 via pipe 14 and pipe 15. High-frequency power supply 16 applies a high-frequency voltage between electrode 2 and electrode 3 and is coupled to electrode 3.

Work 20 is placed on electrode 3. A plurality of adsorption holes 17 are formed in the top of electrode 3. Electrode 3 is coupled to first vacuum pump 21 which is a first vacuum evacuating means via evacuating path 23. When adsorption holes 17 are evacuated by first vacuum pump 21, work 20 is fixed by adsorption. Valve 22 is placed in evacuating path 23 between first vacuum pump 21 and lower electrode 3, and opens and closes evacuating path 23.

Atmospheric pressure-release unit 24 is coupled to evacuating path 23 via valve 25. When valve 25 opens, the vacuum in adsorption holes 17 is released and the pressure in adsorption holes 17 is equal to an atmospheric pressure, and then the vacuum in work 20 is also released. Second evacuating pump 26, which is a second evacuating means, evacuates vacuum chamber 1 and is coupled to evacuating path 30 via valve 28. Atmospheric pressure-release unit 27, which returns the pressure in vacuum chamber 1 to atmospheric pressure, is coupled to evacuating path 30 coupled to vacuum chamber 1 via valve 29. Evacuating path 30 is coupled to hole 18 in vacuum chamber 1.

A pressure in adsorption holes 17 is measured by pressure measuring device 31. A pressure in vacuum chamber 1 is measured by pressure-measurement device 32. Pressure-measurement devices 31 and 32 are coupled to evacuating paths 23 and 30 respectively. Measured signals are fed into control section 33. Control section 33 is coupled to high-frequency-power-supply 16, first vacuum pump 21 and second vacuum pump 26, as shown by dash lines, and functions to control these components.

In FIG. 1, window 40 for transferring work 20 to and from the space between the electrodes is disposed in the side wall of vacuum chamber 1. Cover 41 is placed at window 40 and coupled to rod 43 in cylinder 42. When rod 43 presses down into and pull up from cylinder 42, window 40 opens and closes, namely, cover board 41 and cylinder 42 are a means for opening and closing window 40.

Work-transfer means 50 for transferring work 20 to and from vacuum chamber 1 is located near vacuum chamber 1 on the side of window 40. Work-transfer means 50 is equipped with movable unit 51. Movable unit 51 includes X-table 52, Y-table 53 and Z-table 54. Rod 55 is disposed on Z-table 54 and holding head 57 is mounted on the front end of horizontal arms 56 coupled to the top end of rod 55. Holding head 57 holds work 20 by a vacuum adsorption means with adsorption holes formed underneath holding head 57. X-table 52 and Y table 53 move holding head 57 horizontally and Z-table moves it vertically. Control section 33 also controls cylinder 42 and work transferring means 50.

The plasma treatment apparatus of the present invention includes the configuration as shown above.

A method of plasma treatment is described below. FIG. 3 through FIG. 7 shows each process of plasma treatment in order. FIG. 8 is a graph showing change of pressure P1 in adsorption holes 17 and pressure P2 in vacuum chamber 1.

Figure 2:
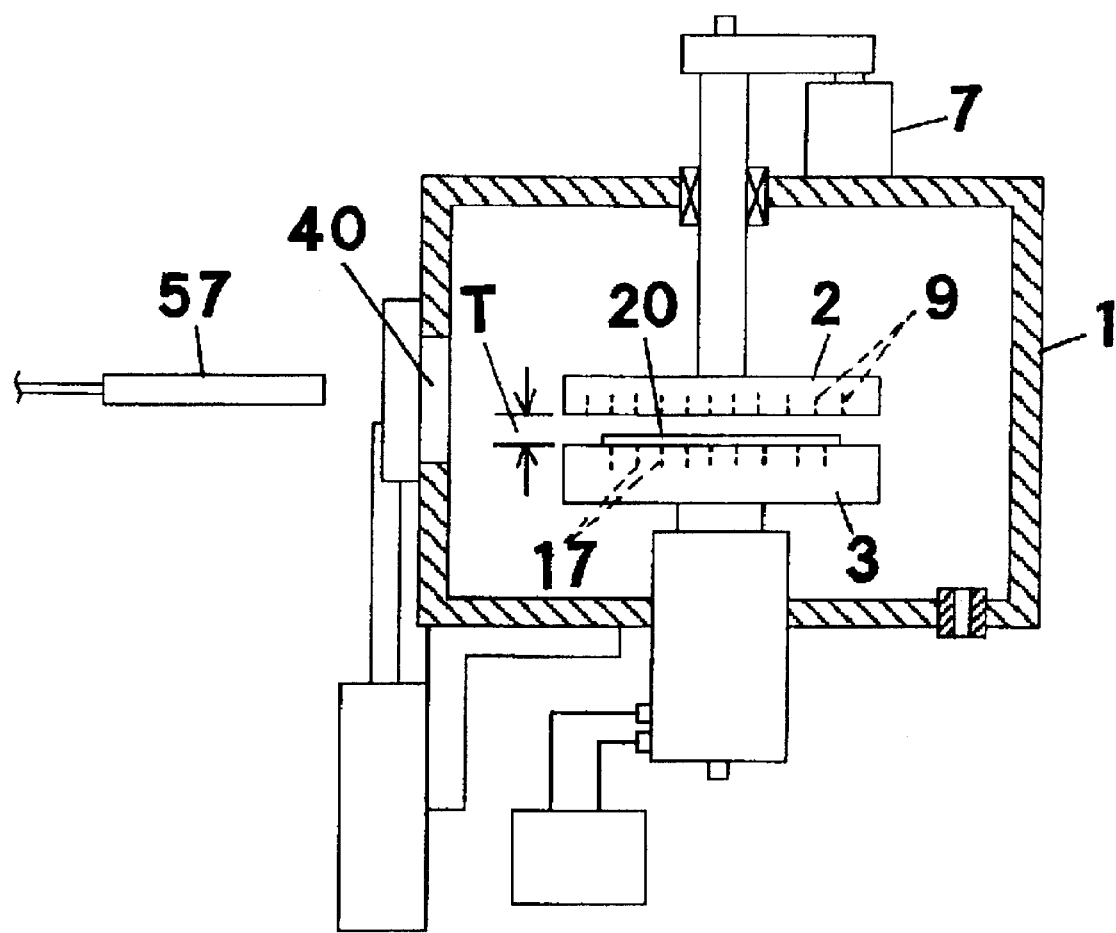
FIG. 2 is a cross sectional view of the plasma treatment apparatus in accordance with the exemplary embodiment of the present invention.

FIG. 2 shows the plasma treatment apparatus in the process of a plasma treatment. As electrode 2 moves down so as to be close to electrode 3 and spacing T becomes narrow. Work 20 is on electrode 3. The process of plasma treatment shown in FIG. 2 is described with reference to FIG. 8.

First vacuum pump 21 begins evacuating from adsorption holes 17 (timing 1 shown in FIG. 8). When a pressure in adsorption holes 17 reduces to setting pressure 1, for example about 100 Pa (timing 2), second vacuum pump 26 begins evacuating vacuum chamber 1 (timing 3) and evacuates until reaching setting pressure 2, for example, about 500 Pa.

As shown in FIG. 8, setting pressure 1 is predetermined at a slightly lower value than setting pressure 2. Control section 33 controls the vacuum pumps such that pressure P1 in adsorption holes is lower than pressure P2 in the vacuum chamber 1. Namely, control section 33 controls vacuum pumps 21 and 26 so that an adsorption force attracting work 20 by first vacuum pump 21 becomes higher than a force peeling work 20 from electrode 3 by second vacuum pump 26.

According to the present invention, work 20 is securely fixed on electrode 3 by using an inexpensive vacuum pump. However, when attracting force by first vacuum pump 21 is lower than evacuation force by second evacuate force, work 20 is not fixed on electrode 3 and floated in vacuum chamber 1, therefore, a stable plasma treatment can not be performed.

Pressure P1 in adsorption holes and pressure P2 in vacuum chamber 1 are monitored by pressure measuring devices 31 and 32. Control section 33 controls vacuum pumps 21 and 26 according to each value measured by pressure measuring devices 31 and 32. Control section 33 also sets setting pressure 1 and setting pressure 2, computes and judges to run a program. Finally, control section 33 controls the vacuum pumps so that pressure P1 in adsorption holes 17 reduced to a pressure not more than 10 Pa.

Before and after that, gases for generating plasma are blown off from gas blow-off hole 9 in electrode 2 to electrode 3 (timing 4), high-frequency voltage is applied to electrode 3 (timing 4). Consequently, plasma is generated between electrode 2 and electrode 3, and then the generated ions physically bombards and simultaneously chemically react with the top surface of work 20. As a result, the plasma treatment becomes faster.

According to the configuration of the present invention, when spacing T between electrodes is predetermined at a short distance, a plasma density between electrode 2 and electrode 3 can be increased. As a result, isotropic etching is performed, and an etching rate (the etching speed) becomes high, therefore, the desired plasma treatment is completed in a short time. Pressure P2 rises during the transition from timing 3 to timing 4 because supply of gases for generating plasma begins. The plasma treatment is performed with supplying gases during the transition from timing 5 to timing 6, and pressure P2 in vacuum chamber 1 is kept in the range of treating pressure.

When plasma treatment is completed, supply of gases for generating plasma stops (timing 6). After checking that pressure P2 reaches setting pressure 2 and gases for generating plasma are exhausted from vacuum chamber 1, valve 28 is opened to release the vacuum in vacuum chamber 1 and a pressure in vacuum chamber 1 becomes equal to atmospheric pressure (timing 7). Then valve 22 is opened to release the vacuum in adsorption holes 17 and a pressure in adsorption holes become equal to atmospheric pressure (timing 8). Thus, as the vacuum in adsorption holes 7 is released after the vacuum in vacuum chamber 1 is released, work 20 does not peel from electrode 3. Pressure P2 reduces during the transition from timing 6 to timing 7 because supply of gases for generating plasma stops.

In a conventional plasma treatment apparatus, the work is fixed on the lower electrode by a static chuck means. The static chuck means is extremely expensive. The expensive-static-chuck-means results in a high cost. In the plasma treatment apparatus in the present embodiment, an inexpensive vacuum pump can be used to fix the work on electrode 3 by controlling the apparatus as described above.

Figure 3:
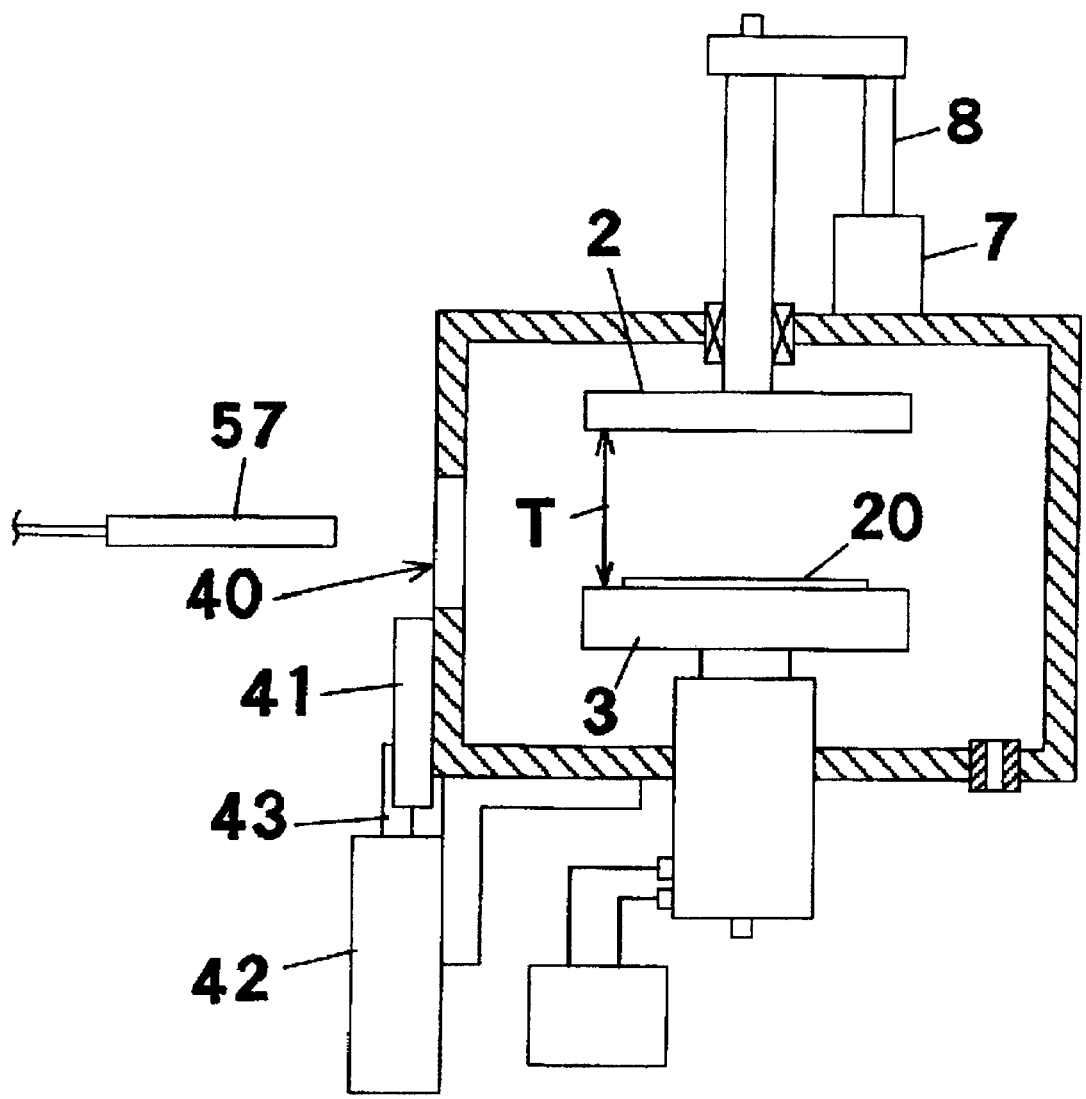
FIG. 3 is a cross sectional view of the plasma treatment apparatus in accordance with the exemplary embodiment of the present invention.
Figure 4:
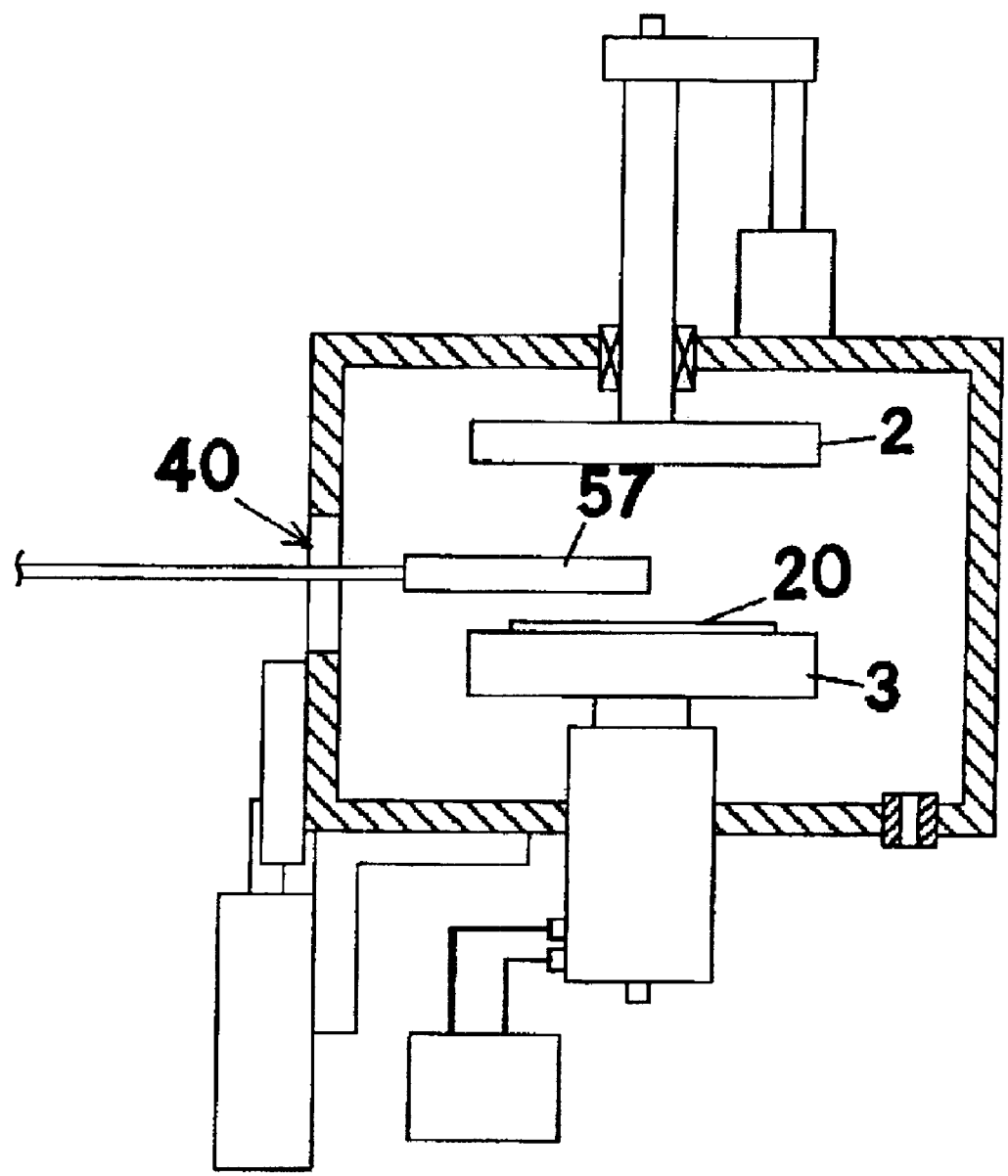
FIG. 4 is a cross sectional view of the plasma treatment apparatus in accordance with the exemplary embodiment of the present invention.
Figure 5:
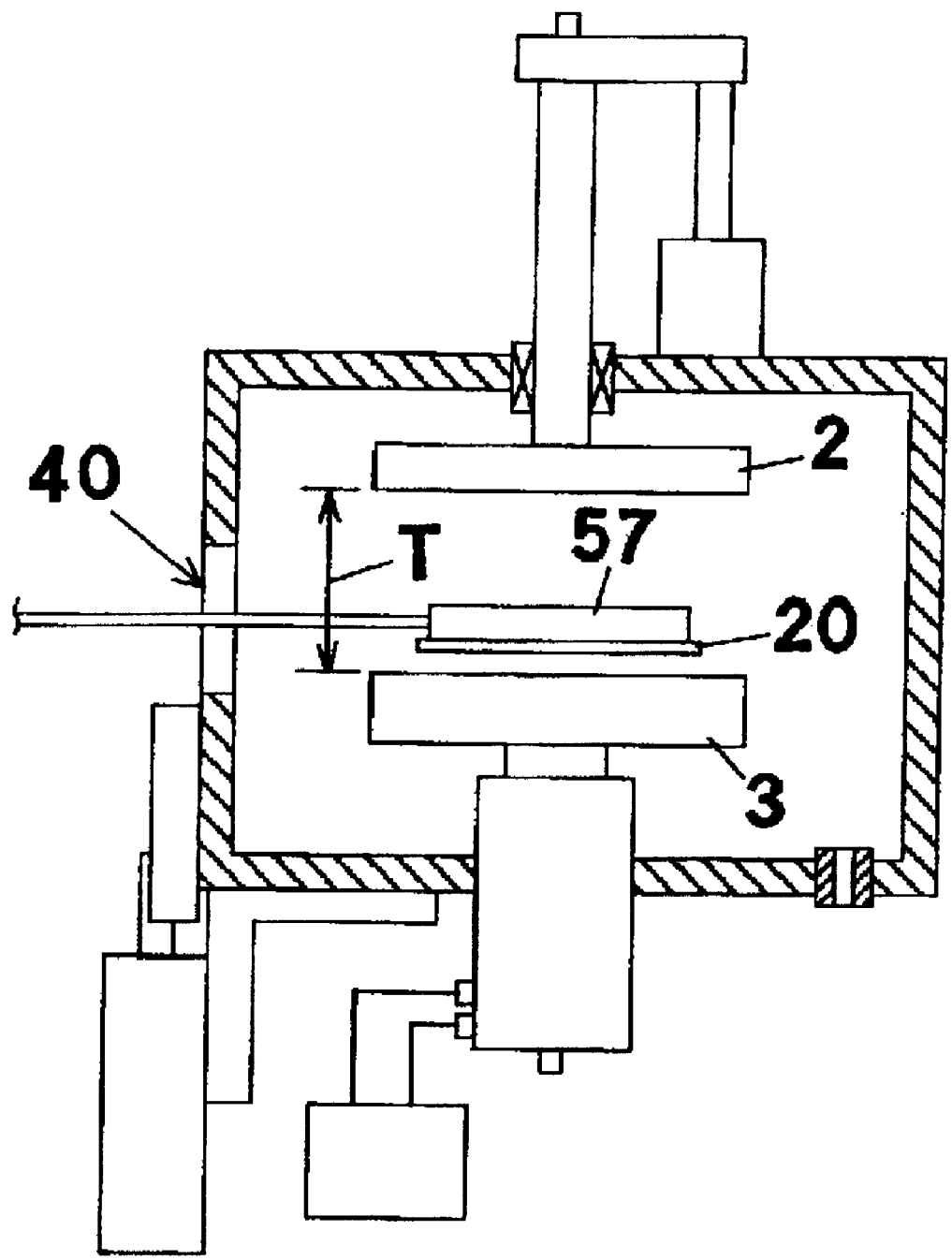
FIG. 5 is a cross sectional view of the plasma treatment apparatus in accordance with the exemplary embodiment of the present invention.

When the plasma treatment is completed, rod 8 in cylinder 7 is pulled up to raise upper electrode 2 as shown in FIG. 3. Spacing T between upper electrode 2 and lower electrode 3 is increased to a distance such that the two electrodes do not disturb the transferring of work 20. Window 40 is opened by lowering cover 41 with pressing down rod 43 of cylinder 42. Holding head 57 is disposed at the side of window 40 and inserted into vacuum chamber 1 from window 40. Holding head 57 moves vertically over electrode 3 and picks up work 20 by vacuum adsorption. Holding head 57 can move into the space between the electrodes and move vertically with ease within spacing T. Work transfer means 50 moves hold head 57 horizontally and vertically.

Figure 6:
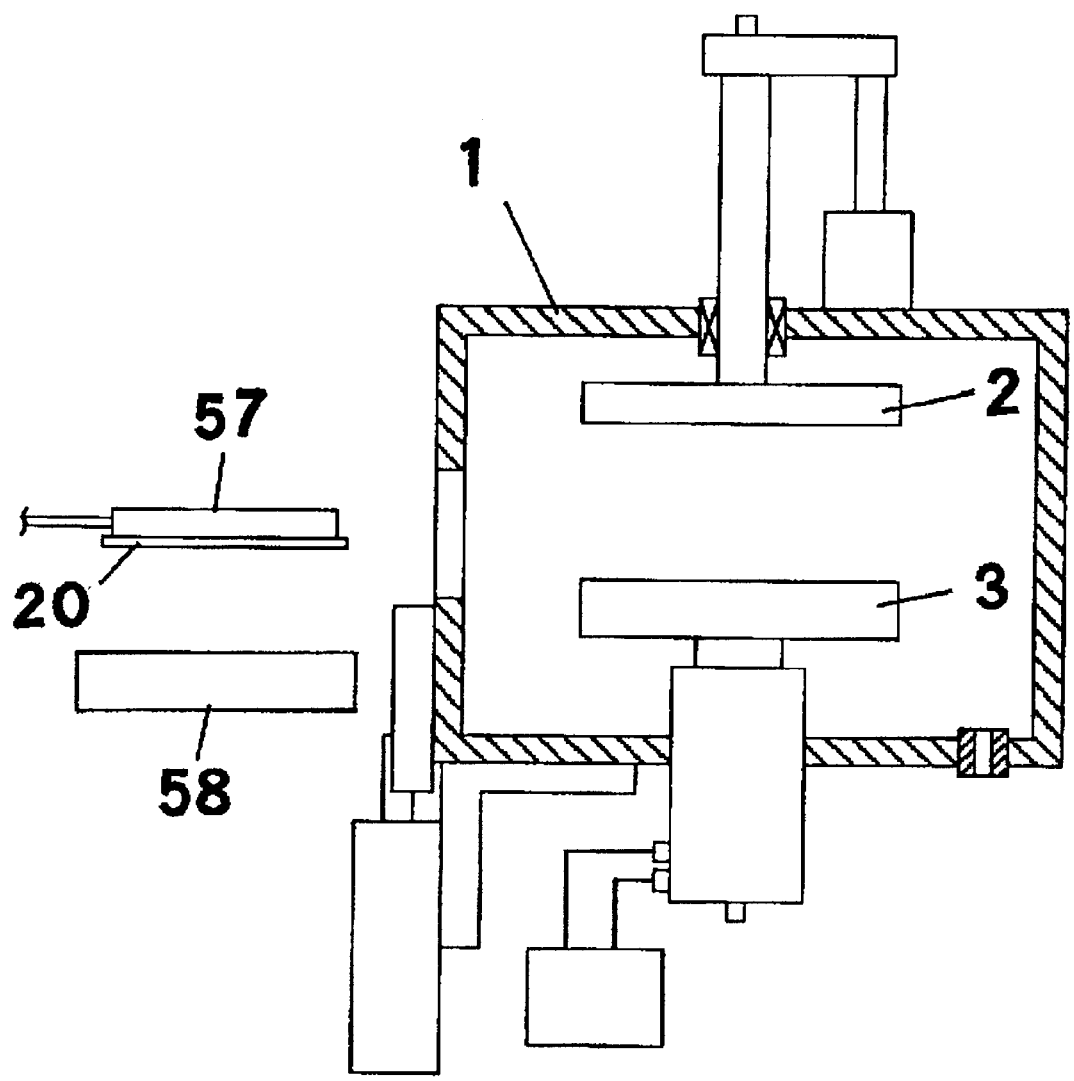
FIG. 6 is a cross sectional view of the plasma treatment apparatus in accordance with the exemplary embodiment of the present invention.

Then, as shown in FIG. 6, holding head 57 moves out of vacuum chamber 1 and puts work 20 on collecting section 58. And then, holding head 57 picks up a next work 20 in a supplying section (not shown), moves into vacuum chamber 1 and transfers the next work 20 onto electrode 3. As shown in FIG. 7, when holding head 57 moves out of vacuum chamber 1, cover 41 rises and then closes window 40. Electrode 2 moves down and spacing T narrows enough for plasma treatment. The plasma treatment process returns to the first situation as shown in FIG. 2 and operations above-mentioned are repeated.

In the present embodiment, the plasma treatment apparatus can treat many kinds of materials.

Then, the plasma treatment for the rear face (having no circuits on the face) of a silicone wafer having a semiconductor circuit is described. The rear face of the silicone wafer is machine-polished. Therefore, a stress layer is in the rear face of the silicone wafer. As this stress layer can lead to deterioration of mechanical strength in the silicon wafer, removing the stress layer by deep etching (for example 5 $\mu$m) on the entire rear face is needed.

However, as a conventional plasma treatment apparatus that has been designed for anisotropic etching, the plasma density is low and also etching rate is low. Therefore, the conventional plasma treatment is difficult to use or impossible to use in the plasma treatment of silicon wafer.

In the present embodiment, after putting the work on the electrode, a spacing between the upper electrode and the lower electrode is decreased as small as 5 mm to 15 mm. As a result, the plasma treatment is performed at a high plasma density. An exemplary mixture of $SF_6$ and He can be used as gases for generating plasma. In the plasma treatment apparatus of the present invention, thus, as a plasma density rises by decreasing a spacing between two electrodes and isotropic etching is performed at a high plasma density, an etching rate becomes as high as from 1.0 $\mu$m/min. to 2.5 $\mu$m/min. Therefore, the plasma treatment apparatus can be used for the purpose of deep etching such as removing the stress layer from the wafer.

In the prior art, when treating a semiconductor such as etching wafers, the degree of vacuum in the vacuum chamber is set at an extremely low value of about 1 Pa. As a result, a high-capacity vacuum pump is needed. According to the present invention, the pressure in the vacuum chamber is set at an extremely high pressure such as 1000 Pa to 3000 Pa as compared with the conventional plasma treatment apparatus. Therefore, a smaller and lower-capacity vacuum pump can be used, and, further, raising a plasma density can achieve a high-speed etching.

According to the present invention described above, the etching rate is increased by narrowing the spacing between an upper electrode and a lower electrode during plasma treatment. When the work is transferred to and from a space between the upper electrode and the lower electrode after the plasma treatment is completed, the spacing between the two electrodes is opened. Therefore, a desired plasma treatment can be performed at a high etching rate in a short time. Moreover, the work can be easily transferred to and from the space between the upper electrode and lower electrode by a work-transfer means such as a holding head. Furthermore, the plasma density can be increased and the etching rate can be increased by narrowing the spacing between the upper electrode and the lower electrode. This is especially advantageous in the plasma treatment apparatus where a deep etching for removing the stress layer is needed. The work can be securely fixed on the electrode by an inexpensive vacuum evacuating means, consequently, an stable plasma treatment can be performed.

Although certain specific embodiments of the present invention have been disclosed, it is noted that the present invention may be embodied in other forms without departing from the spirit or essential characteristics thereof. The present embodiments are therefor to be considered in all respects as illustrative and not restrictive, the scope of the invention being indicated by the appended claims, and all changes that come within the meaning and range of equivalency of the claims are therefore intended to be embraced therein.

What is claimed is:

1. A method of plasma treatment comprising the steps of;
   (a) opening a spacing between an upper electrode and a lower electrode in a vacuum chamber and supplying a workpiece to said lower electrode;
   (b) narrowing said spacing so as to reduce the distance between said upper electrode and said lower electrode;
   (c) evacuating said vacuum chamber;
   (d) plasma treating said workpiece with plasma generated by applying a high- frequency voltage between said upper electrode and said lower electrode;
   (e) stopping generation of plasma and ventilating air in said vacuum chamber up to an atmospheric pressure; and
   (f) opening said spacing and transferring said workpiece from said vacuum chamber, wherein said workpiece is plasma treated when said upper electrode and said lower electrode are said reduced distance apart from one another.

2. The method of plasma treatment as defined in claim 1 wherein said spacing during said plasma treatment is 5 mm to 15 mm.

3. The method of plasma treatment as defined in claim 2, wherein the distance between the upper electrode and said lower electrode is selected in accordance with a desired etch rate.

4. The method of plasma treatment as defined in claim 1 wherein said lower electrode includes adsorption holes for attracting a workpiece.

5. The method of plasma treatment as defined in claim 1 wherein said adsorption holes is kept at a lower pressure than a pressure in said vacuum chamber.

6. The method of plasma treatment as defined in claim 1 wherein a frequency of said high-frequency voltage is 13.56 MHz.

7. The method of plasma treatment as defined in claim 1 wherein a gas blows off from the bottom surface of said upper electrode during said plasma treatment.

8. The method of plasma treatment as defined in claim 1 wherein said workpiece is treated by an isotropic etching.

9. The method of plasma treatment as defined in claim 1 wherein a pressure in said vacuum chamber during said plasma treatment is 1000 Pa to 3000 Pa.

10. The method of plasma treatment as defined in claim 1, wherein said upper electrode is movable relative to said lower electrode.

11. The method of plasma treatment as defined in claim 1, wherein the distance between said upper electrode and said lower electrode is adjustable such that the distance can be set within a defined range during plasma treatment.

* * * * *